United States Patent
Yamana et al.

(10) Patent No.: US 8,921,833 B2
(45) Date of Patent: Dec. 30, 2014

(54) ORGANIC ELECTROLUMINESCENT ELEMENT

(75) Inventors: Masahito Yamana, Hyogo (JP); Takeyuki Yamaki, Nara (JP); Hiroki Yabe, Osaka (JP); Masahiro Nakamura, Osaka (JP)

(73) Assignee: Panasonic Corporation, Osaka (JP)

(*) Notice: Subject to any disclaimer, the term of this patent is extended or adjusted under 35 U.S.C. 154(b) by 31 days.

(21) Appl. No.: 13/375,586

(22) PCT Filed: Jun. 2, 2010

(86) PCT No.: PCT/JP2010/059368
§ 371 (c)(1),
(2), (4) Date: Dec. 1, 2011

(87) PCT Pub. No.: WO2010/140629
PCT Pub. Date: Dec. 9, 2010

(65) Prior Publication Data
US 2012/0068171 A1    Mar. 22, 2012

(30) Foreign Application Priority Data
Jun. 2, 2009 (JP) ................. 2009-133020
Jun. 1, 2010 (JP) ................. 2010-125639

(51) Int. Cl.
*H01L 51/50* (2006.01)
*H01L 31/12* (2006.01)
*H01L 51/52* (2006.01)

(52) U.S. Cl.
CPC ........ *H01L 51/5012* (2013.01); *H01L 51/5268* (2013.01); *H01L 51/5024* (2013.01); *H01L 2251/5369* (2013.01)

USPC ................. 257/40; 257/E51.018; 438/99

(58) Field of Classification Search
CPC ............ H01L 51/5012; H01L 51/5024; H01L 51/5268; H01L 2251/5369
USPC ............ 257/40, 642, E51.018; 438/99
See application file for complete search history.

(56) References Cited

U.S. PATENT DOCUMENTS

| | | |
|---|---|---|
| 2007/0007538 A1 | 1/2007 | Ono et al. |
| 2007/0202353 A1 | 8/2007 | Inagaki et al. |
| 2008/0203359 A1* | 8/2008 | Corma Canos et al. . 252/301.16 |
| 2009/0102359 A1* | 4/2009 | Miyata et al. ............. 313/504 |
| 2009/0278147 A1* | 11/2009 | Suzuki ..................... 257/98 |

FOREIGN PATENT DOCUMENTS

| | | |
|---|---|---|
| JP | 2000188183 | 7/2000 |
| JP | 2007-242927 A | 9/2007 |
| JP | 2007-266243 A | 10/2007 |
| WO | 2010/140629 A1 | 12/2010 |

OTHER PUBLICATIONS

English machine translation of JP2007-266243 to Suzuki et al.*

(Continued)

*Primary Examiner* — Tom Thomas
*Assistant Examiner* — Christopher M Roland
(74) *Attorney, Agent, or Firm* — Greenblum & Bernstein, P.L.C.

(57) ABSTRACT

In an organic electroluminescent element, light extraction efficiency is enhanced. An organic electroluminescent element 1 is configured by laminating a substrate 2, a first electrode 3, an organic layer 4, and a second electrode 5 in this order. The organic layer 4 includes an emitting layer 43, and the emitting layer 43 is formed by mixing porous particles 45 into an emitting material 44.

10 Claims, 2 Drawing Sheets

(56) References Cited

OTHER PUBLICATIONS

J.C. Scott et al., "Enhanced Luminance in Polymer Composite Light Emitting Devices", App. Phys. Lett, vol. 71, No. 9., Sep. 1, 1997, pp. 1145-1147.
"International Search Report (ISR).", Application No. PCT/JP2010/059368, Date: Jun. 29, 2010, pp. 1-3.
Yasuto Hoshikawa et al., "Mesoporous Silica Nanoparticles with Remarkable Stability and Dispersibility for Antireflective Coatings," Chem. Mater. 22., pp. 12-14 (2010) (Web Publication Date Dec. 1, 2009).
European Search Report in counterpart European Application No. 10783411 dated Jul. 19, 2013.
"Mesoporous Silica Nanoparticles with Remarkable Stability and Dispersability for Antireflective Coatings," Yasuto Hoshikawa et al., Chem. Mater., vol. 22, No. 1, pp. 12-14 (2010); Published on Web Dec. 1, 1999.

* cited by examiner

ORGANIC ELECTROLUMINESCENT ELEMENT

TECHNICAL FIELD

The present invention relates to an organic electroluminescent element (abbreviated as the organic EL element hereinafter) which is used for a flat panel display, a backlight for a liquid crystal display, an illumination light source, or the like.

BACKGROUND ART

A structure of a conventional organic EL element (refer to non-patent document 1, for example) is shown in FIG. 2. An organic EL element 100 is formed by laminating an anode 11, an organic layer 14 including a hole transport layer 12 and an emitting layer 13, and a cathode 15 on a substrate 10 in this order. One surface of the substrate 10 which is on an opposite side of a surface facing the anode 11 has contact with an atmosphere 16. When a voltage is applied, the anode 11 injects holes into the emitting layer 13 and the cathode 15 injects electrons into the emitting layer 13, and the holes and the electrons are recombined in the emitting layer 13. This recombination causes excitons to be generated, and when the excitons return to their ground state, photons are emitted and extracted outside through the anode 11 and the substrate 10.

When light propagates from a medium with a high refractive index to a medium with a low refractive index, a critical angle at an interface therebetween is determined based on the refractive index between the media in accordance with Snell's law, and light which has a higher incident angle than the critical angle is totally reflected at the interface, confined to the medium with the high refractive index, and lost as guided light.

A refractive index of each layer in the organic EL element 100 is described below. Glass is solely used for the substrate 10 from a standpoint of excellent transparency, intensity, low cost, gas barrier layer, chemical resistance, heat resistance, etc., and a refractive index of a general soda-lime glass or the like is around 1.52.

Indium Tin Oxide (ITO), which is indium oxide doped with tin oxide, or Indium Zinc Oxide (IZO) is widely used for the anode 11 due to its excellent transparency and electric conductivity. Although refractive indexes of ITO and IZO change in accordance with a composition, a film formation method, a crystal construction, or the like, ITO and IZO have extremely the high refractive indexes of approximately 1.7 to 2.3 and approximately 1.9 to 2.4, respectively.

An emitting material, an electron transporting material, a hole transporting material, or the like which is used for the organic layer 14 is a material which has a π conjugated bond system including a number of general benzene rings in its molecular structure, so that its refractive index is approximately 1.6 to 2.0.

Thus, in the organic EL element 100, a magnitude relation among the refractive indexes of the respective layers is expressed as follows: the atmosphere 16 being in contact with the substrate 10<the substrate 10<the organic layer 14<the anode 11. Accordingly, light which is obliquely outputted from an emitting source 13a of the emitting layer 13 in the organic layer 14 at a high angle is totally reflected at an interface between the anode 11 and the substrate 10 and an interface between the substrate 10 and the atmosphere 16 (indicated by a dashed arrow).

Here, the refractive indexes of the atmosphere 16, the substrate 10, the anode 11, the hole transport layer 12, and the emitting layer 13 are expressed as $n_{16}$, $n_{10}$, $n_{11}$, $n_{12}$, and $n_{13}$, respectively. Moreover, incident angles of light from the emitting layer 13 to the hole transport layer 12, from the hole transport layer 12 to the anode 11, from the anode 11 to the substrate 10, and from the substrate 10 to the atmosphere 16 are expressed as $\theta_{13\text{-}12}$, $\theta_{12\text{-}11}$, $\theta_{11\text{-}10}$, and $\theta_{10\text{-}16}$, respectively, and an output angle of light from the substrate 10 to the atmosphere 16 is expressed as $\theta_{16}$. An equation 1 described below is formed in accordance with Snell's law.

$$n_{13} \sin\theta_{13\text{-}12} = n_{12}\sin\theta_{12\text{-}11} = n_{11}\sin\theta_{11\text{-}10} = n_{10}\sin\theta_{10\text{-}16} = n_{16}\sin\theta_{16} \quad \text{[Equation 1]}$$

Equations 2 to 4 described below are extracted from the above equation 1 with a focus on a relationship between the emitting layer 13 and the hole transport layer 12, the substrate 10, and the atmosphere 16 which have lower refractive indexes than that of the emitting layer 13.

$$n_{13}\sin\theta_{13\text{-}12} = n_{12}\sin\theta_{12\text{-}11} \quad \text{[Equation 2]}$$

$$n_{13}\sin\theta_{13\text{-}12} = n_{10}\sin\theta_{10\text{-}16} \quad \text{[Equation 3]}$$

$$n_{13}\sin\theta_{13\text{-}12} = n_{16}\sin\theta_{16} \quad \text{[Equation 4]}$$

Critical angles $\theta_{c12}$, $\theta_{c10}$, and $\theta_{c16}$ of the hole transport layer 12, the substrate 10, and the atmosphere 16, respectively, are obtained from equations 5 to 7 described below in accordance with the above equations 2 to 4.

$$\theta_{C12} = \sin^{-1}\left(\frac{n_{12}}{n_{13}}\right) \quad \text{[Equation 5]}$$

$$\theta_{C10} = \sin^{-1}\left(\frac{n_{10}}{n_{13}}\right) \quad \text{[Equation 6]}$$

$$\theta_{C16} = \sin^{-1}\left(\frac{n_{16}}{n_{13}}\right) \quad \text{[Equation 7]}$$

When $n_{13}$=1.8, $n_{12}$=1.6, $n_{10}$=1.52, and $n_{16}$=1.0, for example, are substituted into the above equations 5 to 7, the critical angles $\theta_{C12}$, $\theta_{C10}$, and $\theta_{C16}$ are determined to be 63°, 58°, and 34°, respectively. Light which is outputted from the emitting source 13a of the emitting layer 13 at a higher angle than the above angles is confined to the emitting layer 13, the anode 11, or the substrate 10, which causes a light loss. Thus, light extraction efficiency in the organic EL element 100 is reduced and external quantum efficiency is thereby reduced. The light extraction efficiency indicates a ratio between photons generated in the emitting layer and photons which reach any layer or which are emitted to the atmosphere out of the photons generated in the emitting layer. The external quantum efficiency indicates a ratio of a total number of photons which reach any layer or photons which are emitted to the atmosphere to a total number of electrons recombined in the emitting layer. The external quantum efficiency is obtained by multiplying the above light extraction efficiency by an internal quantum efficiency. The internal quantum efficiency indicates a ratio of the total number of generated photons to the total number of the electrons recombined in the emitting layer.

A method for decreasing the above light loss includes lowering the refractive index $n_{13}$ of the emitting layer 13 so that the critical angle is widened. The non-patent document 1 describes a technique of mixing $SiO_2$ into the emitting layer 13 which is formed of MEH-PPV (poly[2-methoxy-5-(2'-ethyl-hexyloxy)-p-phenylene vinylene]) as the above method. A refractive index of $SiO_2$ is 1.6, lower than that of MEH-PPV, so that the refractive index of the emitting layer 13 is lowered by mixing $SiO_2$ particles and the quantum efficiency increases 1.45-fold.

However, even when SiO$_2$ particles which have the refractive index of 1.6 are mixed, the refractive index of the emitting layer 13 does not fall below 1.6 but remains higher than the refractive index n$_{10}$=1.52 of the substrate 10 and the refractive index n$_{16}$=1.0 of the atmosphere 16. As a result, a lot of light is still confined to the anode 11 and the substrate 10 and is thereby lost. Consequently, a further reduction of the refractive index of the emitting layer 13 and an enhancement of the light extraction efficiency are required.

PRIOR ART DOCUMENT(S)

Non-Patent Document(s)

Non-patent Document 1: "Enhanced luminance in polymer composite light emitting devices", by Carter, S. A. et al., Applied Physics Letters, 1997, 71(9), pp. 1145

SUMMARY OF THE INVENTION

Problems to be Solved by the Invention

The present invention is to solve the above conventional problems, and an object of the present invention is to provide an organic electroluminescent element which can enhance light extraction efficiency.

Means to Solve the Problem(s)

The organic electroluminescent element of the present invention is configured by laminating a substrate, a first electrode, an organic layer including an emitting layer, and a second electrode in this order, wherein the emitting layer is formed by mixing a porous particle in an emitting material.

It is preferable that in the organic electroluminescent element, a refractive index of the emitting layer is lower than 1.6.

It is preferable that in the organic electroluminescent element, the porous particle is a porous silica particle.

It is preferable that in the organic electroluminescent element, the porous silica particle is a mesoporous silica nanoparticle.

It is preferable that in the organic electroluminescent element, plural mesopores, each of which has a pore diameter of 2 nm or more, are arranged at regular intervals inside the mesoporous silica nanoparticle.

It is preferable that in the organic electroluminescent element, a chain hydrocarbon structure is provided on a surface of the mesoporous silica nanoparticle.

It is preferable that in the organic electroluminescent element, an organic functional group having a π conjugated bond is provided on the surface of the mesoporous silica nanoparticle.

It is preferable that in the organic electroluminescent element, a particle diameter of the porous particle is 10 to 100 nm.

It is preferable that in the organic electroluminescent element, the emitting material is a coating-type material.

Effect of the Invention

According to the organic electroluminescent element of the present invention, the porous particles which have a low refractive index are mixed into the emitting layer and the refractive index of the emitting layer is lowered, so that critical angles at the respective interfaces located on the light path from the emitting layer to the outside can be widened. Consequently, the light which is totally reflected and lost at the interfaces can be reduced and light extraction efficiency can be enhanced.

DESCRIPTION OF THE PREFERRED EMBODIMENT(S)

Figure 1:
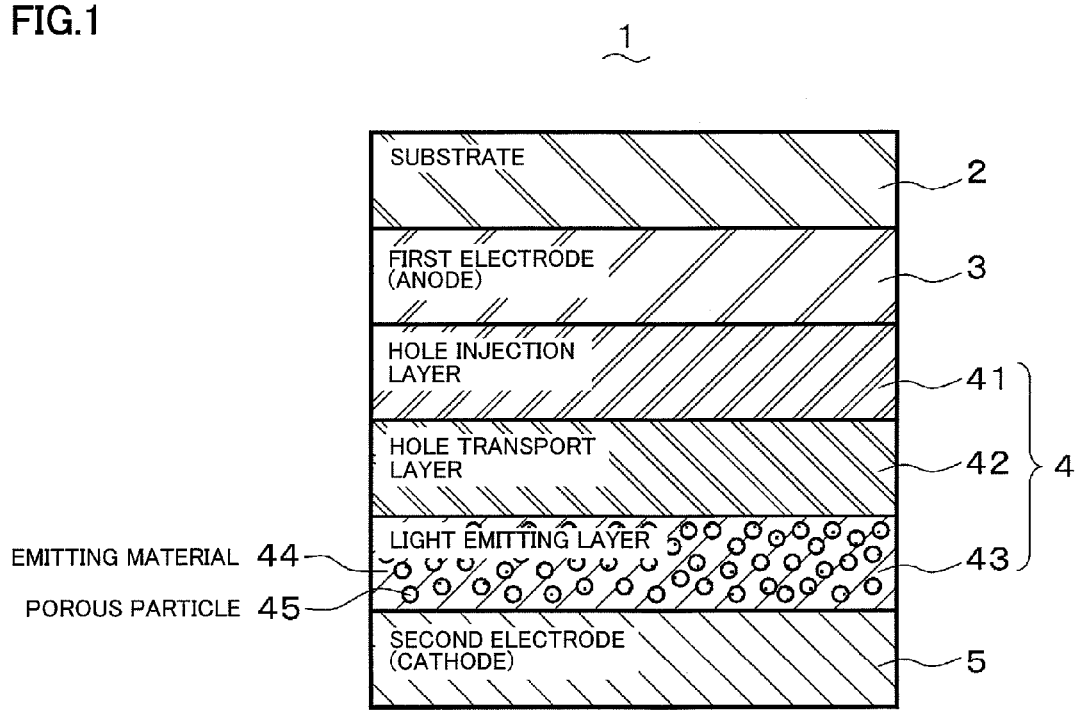
FIG. 1 is a cross-sectional view of an organic EL element according to a preferred embodiment of the present invention.
Figure 2:
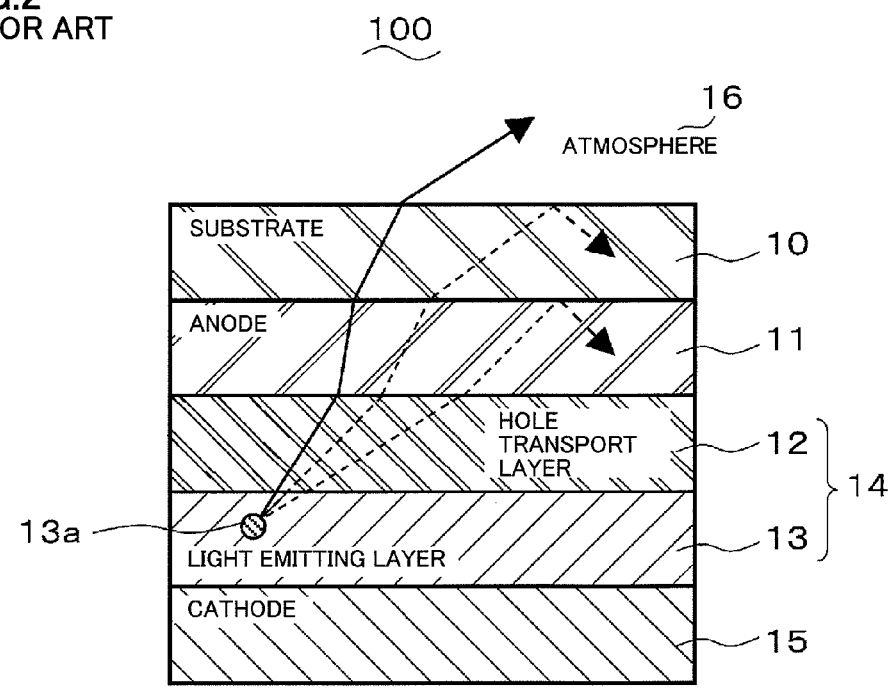
FIG. 2 is a cross-sectional view of a conventional organic EL element.

An organic EL element according to a preferred embodiment of the present invention is described with reference to the drawings. FIG. 1 shows a configuration of an organic EL element 1 of the present preferred embodiment. The organic EL element 1 is configured by laminating, in order from a first electrode 3 side, the first electrode 3, an organic layer 4, and a second electrode 5 on a substrate 2. The first electrode 3 is a light transmissive anode. The organic layer 4 includes, in order from the first electrode 3 side, a hole injection layer 41, a hole transport layer 42, and an emitting layer 43. The emitting layer 43 is formed by mixing porous particles 45 into an emitting material 44. The second electrode 5 is a light reflective cathode. A hole blocking layer, an electron transport layer, and an electron injection layer may further be laminated between the emitting layer 43 and the second electrode 5. When a voltage is applied to the organic EL element 1, the first electrode 3 injects holes into the emitting layer 43 and the second electrode 5 injects electrons into the emitting layer 43. The holes and the electrons are recombined with each other in the emitting layer 43. This recombination causes excitons to be generated, and when the excitons return to their ground state, light is emitted and extracted outside through the first electrode 3 and the substrate 2.

The substrate 2 is made up of a transparent glass plate, a transparent plastic film, a transparent plastic plate, or the like. A soda-lime glass, a non-alkali glass, or the like is used as a material of the transparent glass. Polyester resin, polyolefin resin, polyamide resin, epoxy resin, fluorine contained resin, or the like is used as a material of the transparent plastic. The substrate 2 may be a transparent glass plate into which a heavy metal such as lead, for example, is mixed and has a refractive index of 1.52, for example.

The first electrode 3, which injects the holes into the emitting layer 43, is made up of an electrode material which has a work function of 4 eV (electron volt) or more, for example, and a light transmission rate of 70% or more, for example. The electrode material can be made of CuI, ITO (Indium Tin Oxide), SnO$_2$, ZnO, IZO (Indium Zinc Oxide), GZO (Gallium Zinc Oxide), a conductive polymer such as PEDOT or polyaniline, or another conductive polymer made by doping the afore-mentioned conductive polymer with an acceptor. The first electrode 3 may be a transparent sheet in which a conductive material such as a metal such as gold, an alloy, carbon nanotubes, is dispersed. It is preferable that sheet resistance of the first electrode 3 is several hundred Ω/sq. or less, and 100 Ω/sq. or less is particularly preferable. In order to obtain the above characteristics of the light transmission rate, the sheet resistance, and the like, a film thickness of the first electrode 3 is set to 500 nm or less, and preferably set in a range of 10 to 200 nm, but it depends on the electrode material of the first electrode 3.

The hole injection layer 41 is made up of a low-molecular-weight organic compound such as copper phthalocyanine (CuPC), or a high polymer material such as Polyethylenedioxythiophene/polystyrenesulfonate (PEDOT-PSS).

The hole transport layer 42 is made up of a triarylamine-based compound, an amine compound including a carbazole group, an amine compound including fluorene derivative, or the like whose representative examples are 4,4'-Bis[N-(naphthyl)-N-phenylamino]biphenyl (α-NPD), N,N'-Bis(3-methylphenyl)-(1,1'-biphenyl)-4,4'-diamine (TPD), 2-TNATA, 4,4',4''-tris[N-(3-methylphenyl)N-phenylamino]triphenylamine (MTDATA), 4,4'-N,N'-dicarbazole-biphenyl (CBP), Spiro-NPD, Spiro-TPD, Spiro-TAD, or TNB.

The hole injection layer 41 and the hole transport layer 42 may be deposited by a dry process such as an evaporation method, a transfer method, or may also be deposited by a coating method such as a spin coating, a spray coating, a die coating, a gravure printing.

The emitting material 44 of the emitting layer 43 is a coating-type material, and the emitting layer 43, in which the porous particles 45 are mixed into the emitting material 44 in advance, is deposited by a coating method such as a spin coating, a spray coating, a die coating, a gravure printing.

The emitting material 44 is, for example, anthracene, naphthalene, pyrene, tetracene, coronene, perylene, phthaloperylene, naphthaloperylene, diphenylbutadiene, tetraphenylbutadiene, coumarin, oxadiazole, bisbenzoxazorine, bisstyryl, cyclopentadiene, quinoline metal complex, tris(8-hydroxyquinolinate)aluminum complex ($Alq_3$), tris(4-methyl-8-quinolinate)aluminum complex, tris(5-phenyl-8-quinolinate)aluminum complex, aminoquinoline metal complex, benzoquinoline metal complex, tri(p-terphenyl-4-yl)amine, 1-aryl-2,5-di(2-thienyl)pyrrole derivative, pyrane, quinacridone, rubrene, distyrylbenzene derivative, distyrylarylene derivative, distyrylamine derivative, MEH-PPV, various fluorescent materials, or a mixture of materials optionally selected from these materials. Although the above various materials are fluorescent emitting materials, the emitting material 44 may be a phosphorescence emitting material, or the like which transits from its spin multiplet state to its ground state to emit light, or a compound of which a molecule contains a region made up of the phosphorescence emitting material or the like.

The porous particle 45 is a porous silica particle, and a mesoporous silica is used as the porous silica. A hollow silica or a nanoporous silica may also be used as the porous silica. The material of the porous particle 45 is not limited to the porous silica, and other metal oxide may be applicable.

Since the porous particle 45 includes voids containing air in the particle, it has a low refractive index. It is preferable that a porosity of the porous particle 45 is as high as possible. An equation 8 described below is to obtain the refractive index of the porous particle 45 from the porosity [%] of the porous particle 45 and the refractive index of the material of the porous particle 45.

Refractive index of porous particle=(refractive index of material of porous particle)×(1−porosity/100)+porosity/100 [Equation 8]

As shown in the above equation 8, the porosity of the porous particle 45 needs to be increased to lower the refractive index of the porous particle 45.

The porosity of the mesoporous silica, which is the porous material, can be increased more than that of the hollow silica, so that the mesoporous silica can be made to have the low refractive index. The mesoporous silica particle is preferable since the particle diameter can be controlled while maintaining a predetermined porosity. Moreover, the mesoporous silica particle is particularly preferable since it can easily be dispersed to other materials by forming an organic structure on its particle surface. The organic structure of the mesoporous silica surface includes a chain hydrocarbon structure having three or more carbon atoms or an organic functional group having a π conjugated bond. The chain hydrocarbon structure having the three or more carbon atoms includes saturated hydrocarbon, unsaturated hydrocarbon, and a combination of the saturated hydrocarbon and unsaturated hydrocarbon, and the chain hydrocarbon structure may have a straight chain structure or a branch structure. Moreover, a cyclic hydrocarbon structure or an atom such as nitrogen, oxide, or the like may be bonded to a part of the chain hydrocarbon structure. The organic functional group having the π conjugated bond is not especially limited if it is any organic functional group of which it electrons can be delocalized, and an aryl group such as a phenyl group, a naphthyl group, a styryl group, or a functional group having a fluorene structure, or their derivatives are applicable. Moreover, it is particularly preferable that the particle surface is provided with the same functional group as the organic functional group included in the emitting material 44 by reason that the particle can easily be dispersed.

When the emitting layer 43 has a thickness of tens-hundreds of nm, an average particle diameter of the porous particle 45 is set to 10 to 100 nm. The average particle diameter is determined in accordance with the thickness of the emitting layer 43.

Since the mesoporous silica particle serving as the porous particle 45 has the particle diameter described above, it is also referred to as a mesoporous silica nanoparticle or a mesoporous silica microparticle. The mesoporous silica particle has plural mesopores having a pore diameter of 2 nm or more inside. The mesopores in the particle usually have an arrangement pattern and are often arranged at regular intervals two-dimensionally and hexagonally. In the present invention, the porosity of the mesoporous silica particle is defined as a porosity of the mesopore, which has a column shape, in a planar surface perpendicular to its column direction. A main peak obtained by measuring the mesoporous silica particle by X-ray diffraction method is detected in a (100) plane. A distance between centers of the adjacent mesopores is calculated by multiplying a spacing d100 of the (100) plane by $2/\sqrt{3}$. Moreover, a pore size distribution obtained by a nitrogen absorption method has a peak value of mesopore diameter. In view of a symmetry of the mesopore arrangement, the porosity of the mesoporous silica particle is equivalent to a rate of a sectional area of the mesopore to an area of a hexagon whose opposite side distance is equal to half the distance between centers of the adjacent mesopores. The porosity of the mesoporous silica particle as the porous particle 45 obtained by the above measurement is 20% or more, preferably 25% or more.

Although a manufacturing method of the mesoporous silica nanoparticle is not particularly limited, a mesoporous silica nanoparticle which has an organic functional group on a particle surface and mesopores of a two-dimensional hexagonal structure can be obtained by a method described in a non-patent document "Chem. Mater. 22", pp. 12 to 14 (2010), for example. In water, surfactant takes a hydrophobic portion-containing additive in a hydrophobic portion of the surfactant and forms micelles, and the micells are regularly arranged.

When silicon alkoxide is added and a hydrolysis reaction is performed using a base catalyst, a silica framework having the particulate shape is formed around an outside of the micell, and a surfactant complex silica particle is generated. The organic functional group can be formed on the particle by further using an organic functional group-containing silicon alkoxide such as aminopropyl or the like. The mesoporous silica nanoparticle is made by removing the micell in the surfactant from the surfactant complex silica particle so that the shape of the micell remains as a pore. It is preferable that the micelle is removed by an extraction with acid or alcohol, and when hexamethyldisiloxane is used during the extraction with acid, the particle surface is silylated and a methyl group can be provided at the same time as the extraction. Moreover, any organic functional group can be formed on the particle surface by using siloxane having an organic functional group such as 1,3-diphenyltetramethyldisiloxane, 1,3-di-n-octyltetramethyldisiloxane, or the like instead of hexamethyldisiloxane. Furthermore, when a reactive functional group such as a silanol group, an amino group, an epoxy group, or a vinyl group, is provided on the particle surface, a desired organic functional group can be bonded to the mesoporous silica nanoparticle via the reactive functional group.

The emitting layer 43 is formed by laminating an emitting material, into which the porous particles 45 are mixed in advance, on the hole transport layer 42 which is a foundation layer of the emitting layer 43. The emitting layer 43 may be formed by laminating an emitting material on a mesoporous silica layer which is formed on the hole transport layer 42 in advance. Moreover, the emitting layer 43 into which the mesoporous silica is mixed may be formed by firstly laminating the emitting material 44 with a predetermined thickness on the hole transport layer 42, then forming a mesoporous silica film on the emitting material 44, and subsequently laminating the emitting material 44 on the mesoporous silica film. The thickness of the emitting material 44 which is laminated in advance is preferably thin, that is, for example, 20 nm or less.

The refractive index of the emitting layer 43 is preferably lower than 1.6. The refractive index of the emitting layer 43 is adjusted by selecting the emitting material 44, selecting the material of the porous particle 45, adjusting the porosity of the material of the porous particle 45, or the like.

The second electrode 5, which injects the electrons into the emitting layer 43, has a work function of approximately 5 eV or less, for example. The second electrode 5 may be a light reflective electrode reflecting the light emitted from the emitting layer 43 toward the substrate 2, or may be a light transmissive electrode transmitting the light emitted from the emitting layer 43. When the second electrode 5 is the light reflective electrode, its refractive index is 80% or more, for example, preferably 90% or more. When the second electrode 5 is the light transmissive electrode, its light transmission rate is 70% or more, for example.

An electrode material of the second electrode 5 is a metal, an alloy, an electroconductive compound, or a mixture of the above materials. In particular, the electrode material is an alkali metal, an alkali metal halide, an alkali metal oxide, an alkali earth metal, or an alloy of the above materials and other metal, which is, for example, sodium, sodium-pottasium alloy, lithium, magnesium, magnesium-silver mixture, magnesium-indium mixture, aluminum-lithium alloy, Al/LiF mixture, or the like. Aluminum, silver (Ag), gold (Au), platinum (Pt), $Al/Al_2O_3$ mixture, or the like may also be used as the electrode material. The electrode material may be made by laminating at least one layer of the conductive material such as a metal or the like on a foundation layer, which is made of an alkali metal oxide, an alkali metal halide, or a metal oxide, of the second electrode 5. The laminated conductive material is an alkali metal/Al, an alkali metal halide/alkali earth metal/Al, an alkali metal oxide/Al, or the like. A vicinity of an interface between the second electrode 5 and the organic layer 4 may be doped with an alkali metal such as lithium, sodium, cesium, or an alkali earth metal such as calcium or the like. The second electrode 5 may be formed of a transparent electrode which is made of ITO, IZO, or the like forming on a substrate (not shown) so as to have optical transparency. The second electrode 5 may also be formed of a combination of a transparent electrode and a light reflection layer so as to have light reflectivity.

Each of the electrodes 3 and 5 is made by forming a thin film, which is made of the above electrical material, by a vacuum deposition method, a sputtering method, an application, or the like. In order to obtain the above various characteristics of the light transmission rate and the like, a film thickness of the respective electrodes 3 and 5 is varied depending on their materials and, for example, is set to 500 nm or less. The film thickness is preferably within a range of 10 to 200 nm. The sheet resistance of the respective electrodes 3 and 5 is set to several hundred Ω/sq. or less, however, 100 Ω/sq. or less is preferable.

Four types of the organic EL element 1 as the working examples of the present invention and two types of organic EL element as comparison examples are made.

Working Example 1

An alkali-free glass plate of 0.7 mm thick (No. 1737 manufactured by Corning Incorporated) is used for the substrate 2. Firstly, an ITO layer of 150 nm thickness is formed on the substrate 2 by the sputtering using an ITO target (manufactured by Tosoh Speciality Materials Corporation). The substrate 2 on which the ITO layer is laminated is annealed under Ar atmosphere at 200 degrees Celsius for about one hour, and the first electrode 3 which is made of ITO and has the sheet resistance of 18Ω/□ is formed. The refractive index of the first electrode 3 at a wavelength 550 nm is 2.1 when measured by an optical thin film measuring system ("FilmTek" manufactured by Scientific Computing International).

Next, Polyethylenedioxythiophene/polystyrenesulfonate (PEDOT-PSS) ("Baytron P AL4083" manufactured by H.C. Starck-V TECH Ltd., PEDOT: PSS=1:6) is applied on the first electrode 3 by a spin coater so as to have a film thickness of 30 nm and is subsequently baked at approximately 150 degrees Celsius for ten minutes, and the hole injection layer 41 is obtained. A refractive index of the hole injection layer 41 at a wavelength 550 nm is 1.55 when measured in the same manner as the first electrode 3.

After forming the hole injection layer 41, a solution which is made by dissolving TFB polymer (Poly[(9,9-dioctylfluorenyl-2,7-diyl)-co-(4,4'-(N-(4-sec-butylphenyl))diph enylamine)]) ("Hole Transport Polymer ADS259BE" manufactured by American Dye Source, Inc.) in THF solvent is applied on the hole injection layer 41 by the spin coater so as to have a film thickness of 12 nm, and thus a TFB coating is made. Subsequently, the substrate 2 after coating is baked at 200 degrees Celsius for ten minutes, and the hole transport layer 42 is obtained. A refractive index of the hole transport layer 42 at a wavelength 550 nm is 1.64.

Next, a solution which is made by dissolving red emitting polymer ("Light Emitting Polymer ADS111RE" manufactured by American Dye Source, Inc.) serving as the emitting material 44 in THF solvent is applied on the hole transport layer 42 by the spin coater so as to have a film thickness of 20 nm and subsequently, these are baked at 100 degrees Celsius for ten minutes. Then, a solution, which is made by dispersing the mesoporous silica particles serving as the porous particles 45 which are made in advance in butanol, is applied on the above baked solution and the red emitting polymer ADS111RE is further applied by the spin coater so as to have a film thickness of 100 nm in total, and subsequently, these are baked at 100 degrees Celsius for ten minutes, so that the emitting layer 43 is obtained. A refractive index of the emitting layer 43 at a wavelength 550 nm is 1.55.

Finally, Ba 5 nm thick and aluminum 80 nm thick are laminated on the emitting layer 43 by the vacuum deposition method, and the second electrode 5 is made. Thus, the organic EL element 1 is obtained.

A manufacturing method of the mesoporous silica particles as the porous particles 45 in the working example 1 is described below. $H_2O$: 120 g, 25% $NH_3$ aqueous solution: 5.4 g, ethylene glycol: 20 g, hexadecyltrimethylammonium bromide (CTAB): 1.2 g, 1,3,5-trimethylbenzene (TMB): 1.58 g (a ratio of an amount of substance TMB/CTAB=4), TEOS: 1.29 g, and γ-aminopropyltriethoxysilane: 0.23 g are mixed in a separable flask, to which a cooling tube, an agitator, and a thermometer are attached, and agitated at 60 degrees Celsius for four hours, and the surfactant complex silica particles are obtained.

Next, isopropanol: 30 g, 5N-HCI: 60 g, and hexamethyldisiloxane: 26 g are mixed and agitated at 72 degrees Celsius, and synthesis reaction solution of the surfactant complex silica particles is added to it and agitated and refluxed for thirty minutes. By the above operation, surfactant CTAB and hydrophobic portion-containing additive TMB are extracted from the surfactant complex silica particles and the mesoporous silica particles which have trimethylsilylated particle surfaces are obtained.

The solution after the trimethylsilylation is centrifuged at 20,000 rpm for twenty minutes, and supernatant liquid is removed. By adding ethanol to a precipitated solid phase and shaking the particles in ethanol using a shaker, the mesoporous silica particles are rinsed. Subsequently, it is centrifuged at 20,000 rpm for twenty minutes to remove liquid portion, and the mesoporous silica particles are obtained.

When 0.2 g of the above mesoporous silica particles to which 3.8 g of butanol is added are dispersed again by the shaker, the mesoporous silica particles dispersed in butanol are obtained. A particle diameter of the mesoporous silica particle is approximately 50 nm.

Working Example 2

The organic EL element 1 of the working example 2 is obtained in a manner similar to the working example 1 except for a manufacturing method of the mesoporous silica particles as the porous particles 45. In the organic EL element 1, the refractive index of the emitting layer 43 at a wavelength 550 nm is 1.51.

A manufacturing method of the mesoporous silica particles as the porous particles 45 in the working example 2 is described below. Firstly, the surfactant complex silica particles are obtained in a manner similar to the working example 1.

Next, isopropanol: 30 g, 5N-HCI: 60 g, and 1,3-di-n-octyltetramethyldisiloxane: 57.4 g are mixed and agitated at 72 degrees Celsius, and synthesis reaction solution of the surfactant complex silica particles is added to it, and then agitated and refluxed for thirty minutes. By the above operation, surfactant and hydrophobic portion-containing additive are extracted from the surfactant complex silica particles, so that the mesoporous silica particles are obtained which have the particle surfaces on which an octyl group serving as hydrocarbon with eight carbon atoms and the methyl group are formed.

The mesoporous silica particles dispersed in butanol are obtained from the mesoporous silica particles which are made in the above processing in a manner similar to the working example 1. A particle diameter of the mesoporous silica particle is approximately 50 nm.

Working Example 3

A solution which is made by dissolving red emitting polymer ("Light Emitting Polymer ADS111RE" manufactured by American Dye Source, Inc.) and the mesoporous silica particles, which are made in advance, in THF solvent at a ratio by weight of 1 to 1 is applied on the hole transport layer 42 by the spin coater so as to have a film thickness of 100 nm. Subsequently, these are baked at 100 degrees Celsius for ten minutes, and the emitting layer 43 is obtained. The organic EL element 1 is obtained in a manner similar to the working example 1 except for the above process. In the organic EL element 1, the refractive index of the emitting layer 43 at a wavelength 550 nm is 1.51.

A manufacturing method of the mesoporous silica particles in the working example 3 is described below. Firstly, the surfactant complex silica particles are obtained in a manner similar to the working example 1.

Next, isopropanol: 30 g, 5N-HCI: 60 g, and 1,3-diphenyltetramethyldisiloxane: 45.8 g are mixed and agitated at 72 degrees Celsius, and synthesis reaction solution of the surfactant complex silica particles is added to it, and then agitated and refluxed for thirty minutes. By the above operation, surfactant and hydrophobic portion-containing additive are extracted from the surfactant complex silica particles, and the mesoporous silica particles having the particle surfaces on which the phenyl group and the methyl group are formed are obtained.

The mesoporous silica particles dispersed in butanol are obtained from the mesoporous silica particles which are made in the above processing in a manner similar to the working example 1. A particle diameter of the mesoporous silica particle is approximately 50 nm.

Working Example 4

The organic EL element 1 of the working example 4 is obtained in a manner similar to the working example 1 except for a manufacturing method of the mesoporous silica particles as the porous particles 45. In the organic EL element 1, the refractive index of the emitting layer 43 at a wavelength 550 nm is 1.51.

A manufacturing method of the mesoporous silica particles as the porous particles 45 in the working example 4 is described below. Firstly, the mesoporous silica particles are recovered from the solution after the trimethylsilylation by the centrifugation in a manner similar to the working example 1 and dispersed in 10 g of toluene. Subsequently, 2 g of epoxy group-containing fluorene (OGSOL EG 200 manufactured by Osaka Gas Chemicals Co., Ltd.) is added to the above solution and agitated at room temperature for twelve hours, so that an epoxy group is reacted with the amino group on the mesoporous silica surface, and fluorine structure is combined with the surface. The solution after the reaction is centrifuged to recover the particles, and the recovered particles are shaken and dispersed again in 1-butanol.

(Evaluation of the Mesoporous Silica Particle)

The mesoporous silica particles which are made in the working examples 1 to 4 are dried, and a transmission electron microscope (TEM) observation, an absorption measurement of nitrogen, and a FT-IR (Fourier Transform Infrared) measurement are performed.

(TEM Observation)

Figure 3:
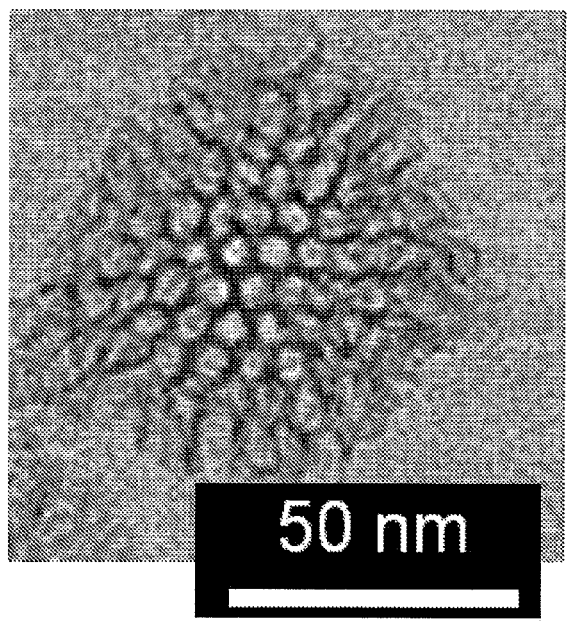
FIG. 3 is a transmission electron microscope (TEM) photograph of a mesoporous silica particle in a working example 1 of the present invention.

A microscopic structure of the mesoporous silica particle in the working example 1 is observed by the TEM of JEM 2000EX11 (manufactured by JEOL Ltd.). A TEM image of the mesoporous silica particle in the working example 1 is shown in FIG. 3. The mesopores forming the two-dimensional hexagonal structure are confirmed. The similar results are obtained in the mesoporous silica particles in the working examples 2 to 4.

(Absorption Measurement of Nitrogen)

An absorption isotherm is measured using Autosorb-3 (manufacture by Quantachrome Instruments), and the pore size distribution is obtained by BJH method. The pore size of the particles in the working examples 1 to 4 has a peak top of approximately 5 nm, and a pore capacity is 1.9 cc/g.

(FT-IR Measurement)

Figure 4:
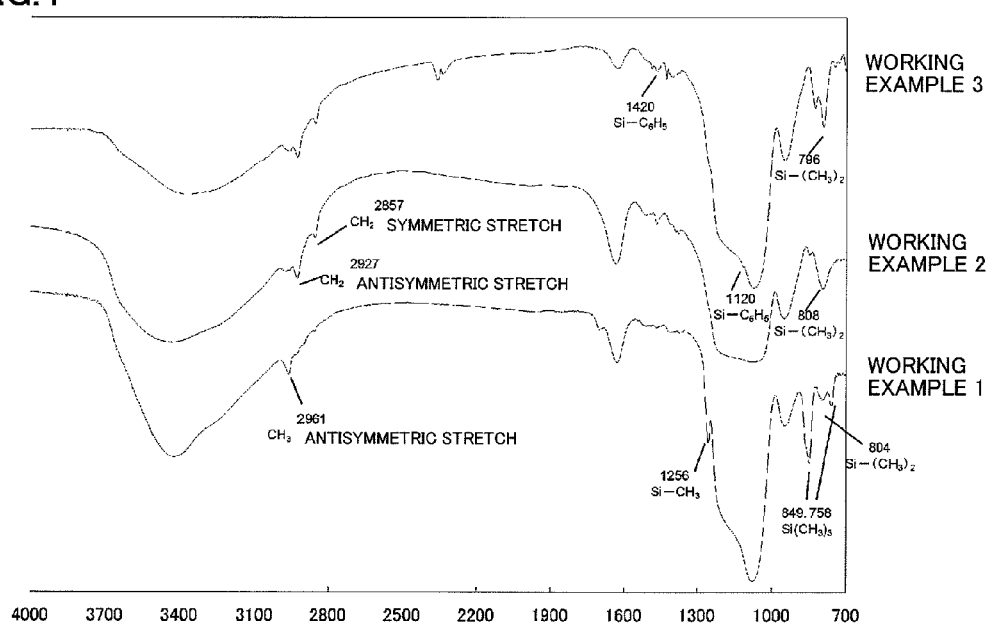
FIG. 4 is a graph showing an infrared absorption spectrum of the mesoporous silica particle in the working example 1 to a working example 3 of the present invention.

The infrared absorption spectrums in the working examples 1 to 3 are measured using a measuring apparatus of FT-IR-670 Plus (manufactured by JASCO Corporation), and the functional groups of the particle surfaces are confirmed. FIG. 4 shows the infrared absorption spectrums of the mesoporous silica particles obtained in the working examples 1 to 3. Characteristic absorptions are described in the respective spectrums. As shown in the spectrums, a trimethylsilyl group $(Si-(CH_3)_3)$ is confirmed in the working example 1, and in the working example 2, compared to the working example 1, an increase of $CH_2$ peak is confirmed, so that an existence of the octyl group is suggested, and simultaneously a peak of the trimethylsilyl group disappears but $(Si-(CH_3)_2)$ is confirmed, so that a formation of the octyl group and the methyl group is suggested. In the working example 3, compared to the working example 1, an existence of the phenyl group is confirmed, and the peak of the trimethylsilyl group disappears but $(Si-(CH_3)_2)$ is confirmed, so that a formation of the phenyl group and the methyl group is suggested. Consequently, it is confirmed that a mesoporous silica microparticle which has the various types of organic functional groups on its surface is formed by an organosilicon compound which includes a siloxane bond in a molecule.

Comparison Example 1

An organic EL element of the comparison example 1 is obtained in a manner similar to the working example 1 except that the porous particles 45 are not mixed into the emitting layer 43. In the organic EL element, the refractive index of the emitting layer 43 at a wavelength 550 nm is 1.67.

Comparison Example 2

An organic EL element of the comparison example 2 is obtained in a manner similar to the working example 1 except that the porous particles which are mixed into the emitting layer 43 are $SiO_2$. In the organic EL element, the refractive index of the emitting layer 43 at a wavelength 550 nm is 1.65.

(Evaluation Test)

The evaluation test is performed on the organic EL elements 1 in the working examples 1 to 3 and the organic EL elements in the comparison examples 1 and 2. In the present evaluation test, an electrical current having current density of 10 mA/cm$^2$ is applied between the electrodes 3 and 5, and the light which is emitted to the atmosphere is measured using an integrating sphere. Moreover, a hemispherical lens made of glass is disposed on an emitting surface of the organic EL element 1 with matching oil which has the same refractive index as the glass, interposed between the hemispherical lens and the emitting surface of the organic EL element 1, and light reaching the substrate 2 from the emitting layer 43 is measured in a manner similar to the above measuring method. Subsequently, respective external quantum efficiencies of the light emitted to the atmosphere and the light reaching the substrate 2 are calculated in accordance with the measurement results. The external quantum efficiency of the light emitted to the atmosphere is calculated from an electrical current supplied to the organic EL element 1 and an amount of the light emitted to the atmosphere, and the external quantum efficiency of the light reaching the substrate 2 is calculated from the electrical current supplied to the organic EL element 1 and an amount of the light reaching the substrate 2.

A result of the above evaluation test is shown in a table 1 below. The respective external quantum efficiencies of the light emitted to the atmosphere and the light reaching the substrate 2 are calculated on the basis of the comparison example 1.

|  | Refractive index of emitting layer | External quantum efficiency | |
|---|---|---|---|
|  |  | Light which is emitted to atmosphere | Light which reaches substrate |
| Working Example 1 | 1.55 | 1.07 | 1.23 |
| Working Example 2 | 1.51 | 1.17 | 1.59 |
| Working Example 3 | 1.51 | 1.17 | 1.59 |
| Comparison Example 1 | 1.67 | 1.00 | 1.00 |
| Comparison Example 2 | 1.65 | 1.01 | 1.03 |

As shown in the above table 1, the organic EL elements 1 of the working examples 1 to 4, in which the porous particles 45 are the mesoporous silica particles, have the higher external quantum efficiencies compared to those of the comparison example 1, in which the porous particles 45 are not mixed, and the comparison example 2, in which the porous particles 45 are the $SiO_2$ particles. Moreover, in the organic EL elements 1 of the working examples 2 to 4, the emitting layer 43 has the lower refractive index and the higher external quantum efficiency compared to that of the working example 1.

In the organic EL element 1 of the present preferred embodiment, the refractive index of the emitting layer 43 is lowered by mixing the porous particles 45 having the low refractive index, so that critical angles at the respective interfaces located on the light path from the emitting layer 43 to the outside can be widened. Accordingly, the light which is totally reflected to be lost at the interfaces can be reduced. Consequently, extraction efficiency of the light emitted to the substrate 2 and the atmosphere can be enhanced, and as shown in the above evaluation test result, the respective external quantum efficiencies of the light reaching the substrate and the light emitted to the atmosphere can be enhanced.

The refractive index of the emitting layer 43 is 1.6 or less, which is lower than ever before, so that the light extraction efficiency in the organic EL element 1 can be enhanced.

The refractive index of the emitting layer 43 can be lowered by applying the porous silica particle, which has the low refractive index, to the porous particle 45, so that the light extraction efficiency in the organic EL element 1 can be enhanced.

The refractive index of the emitting layer 43 can be lowered by applying the mesoporous silica particle, which has the lower refractive index than the hollow silica, as the porous silica particle, so that the light extraction efficiency in the organic EL element 1 can be enhanced.

In the mesoporous silica particle, the porosity can be increased and the refractive index can be lowered by arranging the plural mesopores having a pore diameter of 2 nm or more at regular intervals inside the mesoporous silica particle. Consequently, the refractive index of the emitting layer 43 can be lowered, and the light extraction efficiency in the organic EL element 1 can be enhanced.

Since the chain hydrocarbon structure is provided on the surface of the mesoporous silica particle, the particles repel each other and can uniformly be dispersed.

The emitting material 44 of the emitting layer 43 is a material which has a $\pi$ conjugated bond system including a number of general benzene rings in its molecular structure. Accordingly, the mesoporous silica particle can easily be mixed into the emitting material 44 by having the phenyl group and the fluorene structure of the $\pi$ conjugated bond system on its surface.

The particle diameter of the porous particle 45 is 10 to 100 nm, which is not too large, so that the porous particles 45 in the emitting layer 43 can be increased in density, and the refractive index of the emitting layer 43 can be even lowered. In addition, the particle diameter is not too small, so that a light emission amount of the emitting layer 43 is not reduced due to an excessive increase in density of the porous particle 45.

Moreover, since the emitting material 44 is a coating-type material, it can be deposited after the porous particles 45 are mixed into the emitting material 44 in advance. Accordingly, a density unevenness of the porous particle 45 can be eliminated. Thus, the refractive index of the emitting layer 43 can be uniformized, and an emission unevenness can be eliminated.

The present invention is not limited to the configuration of the above preferred embodiment, however, various modification are applicable in accordance with an intended use. For example, the organic EL element 1 may have the plural emitting layers 43, and in this case, the first electrode 3 and the plural organic layers 4 including the emitting layer 43 are laminated on the substrate 2 with a charge supply layer interposed between the organic layers 4, and the second electrode 5 is formed on the organic layer 4 which is located on opposite side of the substrate 2. The charge supply layer can be formed of, for example, a metal thin film such as Ag, Au, or Al, a metal oxide such as vanadium oxide, molybdenum oxide, rhenium oxide, or tungsten oxide, a transparent conductive film such as ITO, IZO, AZO, GZO, ATO, or $SnO_2$, a so called laminated body of a n-type semiconductor and a p-type semiconductor, a laminated body of the metal thin film or the transparent conductive film and the n-type semiconductor and/or the p-type semiconductor, a mixture of the n-type semiconductor and the p-type semiconductor, or a mixture of the n-type semiconductor and/or the p-type semiconductor and the metal. The n-type semiconductor or the p-type semiconductor may be made of an inorganic material or an organic material and further, it may also be made of a combination of a mixture of the organic material and the metal, the organic material and the metal oxide, the organic material and organic acceptor/donor material, or the inorganic acceptor/donor material.

Moreover, the plural emitting layers 43 may be laminated in one organic layer 4. When the plural emitting layers 43 are provided, the number of laminated layers is, not limited to but, preferably five or less and more preferably three or less since difficulty in design of an optical and electrical element increases with increasing the number of laminated layers. Moreover, the emitting layer 43 may be deposited by the dry process such as the evaporation method, the transfer method, or the like.

Moreover, the organic layer 4 may be made by appropriately laminating the organic layer such as the electron injection layer, the electron transport layer, the hole blocking layer, the hole injection layer, or the hole transport layer, as necessary. When the electron transport layer is provided, its material is preferably a metal complex known as the electron transporting material such as $Alq_3$, a compound having a hetero ring such as phenanthroline derivative, pyridine derivative, tetrazine derivative, or oxadiazole derivative, or the like, which has a high charge transporting property.

Moreover, in the organic EL element 1, it is also applicable that the first electrode 3 is the cathode and the second electrode 5 is the anode.

DESCRIPTION OF THE NUMERALS 1 organic electroluminescent element (organic EL element)
2 substrate
3 first electrode (anode)
4 organic layer
43 emitting layer
44 emitting material
45 porous particle
5 second electrode (cathode)

The invention claimed is:

1. An organic electroluminescent element that is configured by laminating a substrate, a first electrode, an organic layer including an emitting layer, and a second electrode in this order, wherein
   the emitting layer is formed by mixing a porous particle in an emitting material,
   the porous particle is a porous silica particle comprising a mesoporous silica particle, and
   the emitting layer is formed so that the porous particle is uniformly dispersed within the emitting material of the emitting layer.

2. The organic electroluminescent element according to claim 1, wherein a refractive index of the emitting layer is lower than 1.6.

3. The organic electroluminescent element according to claim 1, wherein plural mesopores, each of which has a pore diameter of 2 nm or more, are arranged at regular intervals inside the mesoporous silica particle.

4. The organic electroluminescent element according to claim 1, wherein a chain hydrocarbon structure is provided on a surface of the mesoporous silica particle.

5. The organic electroluminescent element according to claim 1, wherein an organic functional group having a $\pi$ conjugated bond is provided on a surface of the mesoporous silica particle.

6. The organic electroluminescent element according to claim 1, wherein a particle diameter of the porous particle is 10 to 100 nm.

7. The organic electroluminescent element according to claim 1, wherein the emitting material is a coating-type material.

8. The organic electroluminescent element according to claim 1, wherein the porous particle has a same functional group as an organic functional group included in the emitting material.

9. The organic electroluminescent element according to claim 1, wherein the mesoporous silica particle is produced by a manufacturing method comprising:
- generating a surfactant complex silica particle by making silicon alkoxide hydrolyze by using a base catalyst in a liquid phase including surfactant, water, and hydrophobic portion-containing additive; and
- generating a mesoporous silica particle having an organic functional group provided on a surface of the mesoporous silica particle by extracting surfactant and hydrophobic portion-containing additive from the surfactant complex silica particle by using acid, alcohol, and siloxane having the organic function group.

10. The organic electroluminescent element according to claim 9, wherein the silicon alkoxide comprises an organic functional group-containing silicon alkoxide.

* * * * *